(12) United States Patent
Hsieh et al.

(10) Patent No.: US 7,205,196 B2
(45) Date of Patent: Apr. 17, 2007

(54) MANUFACTURING PROCESS AND STRUCTURE OF INTEGRATED CIRCUIT

(75) Inventors: Hsin-Huang Hsieh, Hsinchu (TW); Chien-Ping Chang, Hsinchu (TW); Mao-Song Tseng, Hsinchu (TW); Tien-Min Yuan, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 11/035,700

(22) Filed: Jan. 14, 2005

(65) Prior Publication Data

US 2006/0046389 A1 Mar. 2, 2006

(30) Foreign Application Priority Data

Aug. 30, 2004 (TW) .............................. 93126104 A

(51) Int. Cl.
*H01L 21/336* (2006.01)
(52) U.S. Cl. ..................... 438/259; 438/212; 257/330

(58) Field of Classification Search ................ 438/212, 438/259, 268, 270, 271; 257/330, 331, 332, 257/341
See application file for complete search history.

(56) References Cited

U.S. PATENT DOCUMENTS 6,710,406 B2 * 3/2004 Mo et al. .................... 257/341
7,005,351 B2 * 2/2006 Henninger et al. ......... 438/268

* cited by examiner

*Primary Examiner*—Phuc T. Dang
(74) *Attorney, Agent, or Firm*—Townsend and Townsend and Crew LLP

(57) ABSTRACT

The present invention provides a manufacturing process and the structure of an integrated circuit. In one embodiment, one polysilicon layer deposition and one polysilicon layer etching are used to form the gate of a trench device and the polysilicon layer of a planar device simultaneously. The present invention not only has overcome the problem of the electric leakage, but also has the advantages of withstanding a higher voltage, reducing the relevant cost and increasing the yields. The present invention possesses the outstanding technical features in the field of the power device.

19 Claims, 5 Drawing Sheets

MANUFACTURING PROCESS AND STRUCTURE OF INTEGRATED CIRCUIT

CROSS-REFERENCES TO RELATED APPLICATIONS

This application claims priority from R.O.C. Patent Application No. 093126104, filed Aug. 30, 2004, the entire disclosure of which is incorporated herein by reference.

BACKGROUND OF THE INVENTION

The present invention relates to a method for fabricating an integrated circuit and the structure formed therefrom, and particularly to the method for fabricating a trench device and a planar device simultaneously and to the structure obtained therefrom.

The power metal oxide semiconductor field effect transistor (MOSFET/MOS) has a high input impedance, and thus the power MOS is easily damaged by an electrostatic discharge (ESD) protection pulse. Moreover, the MOS with lower threshold voltage (Vt) is desirable so that the thickness of its gate oxide layer should be maintained thin. Under such a requirement, once 15–20 voltages are applied to the MOS, the gate oxide thereof would be easily damaged and the problem of an electric leakage may occur. Therefore, it is necessary to employ an electrostatic discharge protection circuit in the application of a power MOS.

According to the conventional technique for fabricating an integrated circuit, a power MOS is fabricated first, and then an electrostatic discharge protection circuit is formed. The N type MOS is one example. In the conventional trench double-diffused MOS (trench-DMOS) manufacturing process, a semiconductor material of the epitaxial silicon layer has trenches, and firstly an oxide layer is formed on the surface of the semiconductor material.

After the oxide layer is formed, a doped polysilicon layer is filled into the trenches and the gate of the power MOS would be formed by subsequently etching the doped polysilicon layer exposed outside of the trenches. When the gate of the power MOS is formed, a second polysilicon layer is deposited on the surface of the oxide layer and then some P type dopants are fully implanted into this polysilicon layer. Next, a photoresist is employed to protect a part of this polysilicon layer from a second polysilicon etching so as to form the polysilicon layer for the electrostatic discharge protection circuit.

FIG. 1 is a schematic view showing a conventional trench double-diffused MOS with an ESD protection circuit. The epitaxial layer epi is used for the semiconductor material and has the trenches 14. On the surface of the semiconductor material is the oxide layer 12. The oxide layer 12 can be used as the gate oxide layer of the trench MOS 15 and the dielectric layer of the ESD protection circuit 17 simultaneously. On the oxide layer 12, the trench MOS 15 and the ESD protection circuit 17 are formed thereon. The gate 11 of the trench MOS 15 and the polysilicon layer 13 of the ESD protection circuit 17 are formed from the first and the second etching respectively. The above two etching and the washing in the acid tanks thereafter would erode the corner gate oxide layer 121, and would cause the electric leakage on the gate oxide layer. Furthermore, in order to cope with the electric demand of fabricating a thin gate oxide layer, the problem of electric leakage would become serious.

In the conventional technique, a power MOS is fabricated first, and then an electrostatic discharge (ESD) protection circuit is formed. Under such a manufacturing process, two polysilicon layer depositions and two polysilicon layer etchings are used so that the gate oxide layer is easily eroded and thus the problem of electric leakage would occur.

Therefore, how to simplify the manufacturing process and how to prevent the gate oxide layer from an erosion have become the major problems waiting to be solved in the industry. In order to overcome the drawbacks in the prior art, a method and the structure for fabricating an integrated circuit are provided. In the particular invention, the problem of electric leakage is solved and it has the advantages of reducing the relevant costs and increasing the yields.

BRIEF SUMMARY OF THE INVENTION

The present invention relates to a method for fabricating an integrated circuit and the structure thereof. The method is applied to fabricate a trench device and a planar device simultaneously. One benefit is that only one polysilicon layer deposition and only one polysilicon layer etching are used to form the gate of a trench device and the polysilicon layer of a planar device simultaneously. Since the gate oxide layers on the trenches at the corner are merely etched one time by the plasma, the gate oxide layers could withstand the higher voltage and could reduce the problem of electric leakage. Especially, when the present invention is applied to products having thin gate oxide layers, they would withstand the higher voltage as compared to the gate oxide layers in prior devices.

The present invention will be described using specific embodiments, and it includes the method for fabricating an integrated circuit and the structure obtained therefrom.

DETAILED DESCRIPTION OF THE INVENTION

The present invention will now be described more specifically with reference to the following embodiment. It is to be noted that the following description of the exemplary embodiment of this invention is presented herein for the purpose of illustration and description only; it is not intended to be exhaustive or to be limited to the precise form disclosed.

In order to improve the conventional process of employing two polysilicon layer depositions and two polysilicon layer etchings and to solve the relevant problem of electric leakage at the gate oxide layer, the invention provides a new method for fabricating an integrated circuit and the structure of the integrated circuit formed therefrom.

According to the exemplary embodiment of the present invention, the method for fabricating an integrated circuit is illustrated in FIGS. 2(a)–2(e).

Figure 1:
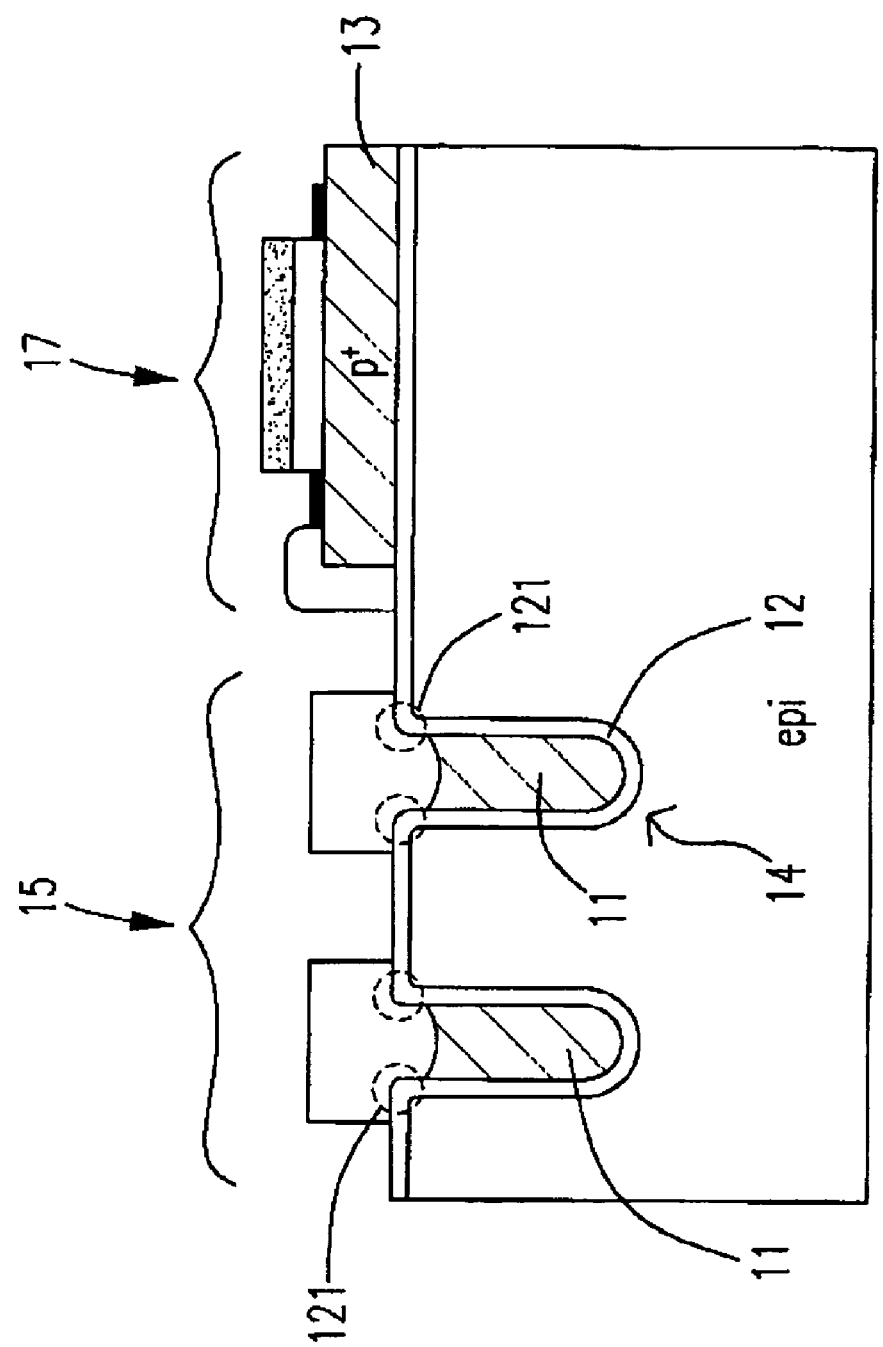
FIG. 1 is a schematic view showing a conventional trench double-diffused MOS with an ESD protection circuit.
Figure 2A:
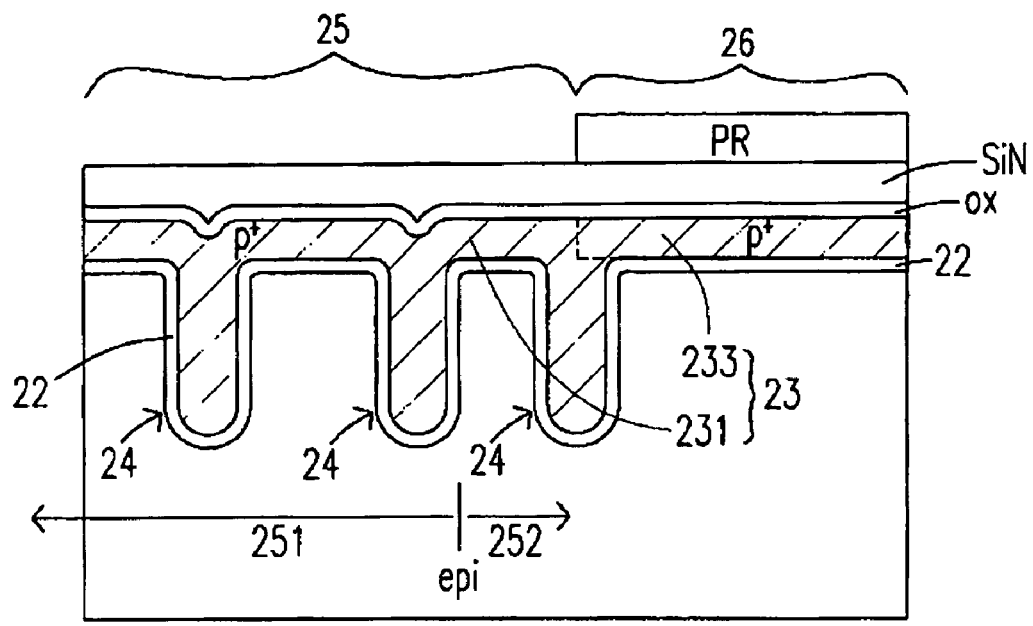
FIGS. 2(a)–2(e) are the flow charts illustrating a manufacturing process of an integrated circuit according to an embodiment of the present invention.

In FIG. 2(a), the epitaxial layer epi is used for the semiconductor material and has the trenches 24. The oxide layer 22 is formed on the surface of the semiconductor material. Then, the undoped polysilicon layer 23 is deposited on the oxide layer 22. The undoped polysilicon layer 23 includes the polysilicon layer 231 of the trench area 25 and the polysilicon layer 233 of the planar area 26. The trench area 25 further includes the cell area 251 and the gate bus area 252. The trenches 24 in the gate bus area 252 are configured to connect and elongate the polysilicon layers 231 in the cell area 251 to a gate pad (not shown).

In the present embodiment, FIGS. 2(a)–2(e) show a set of cross-sectional views. Alternatively, different cross sections applied would have different views. For example, it might be that just the trenches of the cell area 251 are illustrated.

As seen in FIG. 2(a), the P type ions (P+) are implanted into the polysilicon layer 23, and then the surface of the polysilicon layer 23 is heated to form the oxide layer ox. The silicon nitride layer SiN is further deposited on the oxide layer ox, and then the photoresist PR is formed on the silicon nitride layer SiN.

The photoresist PR is covered approximately to the half opening of the trench 24 in the gate bus area 252, and it prevents the gate oxide layer 22 from an unexpected over etching while the polysilicon 23 is etching. The unexpected over etching, caused by the plasma moving downward and rebounding from the side wall, is called micro trenching effect, and it occurs at the vertical interface covered or uncovered by the photoresist PR.

Figure 2B:
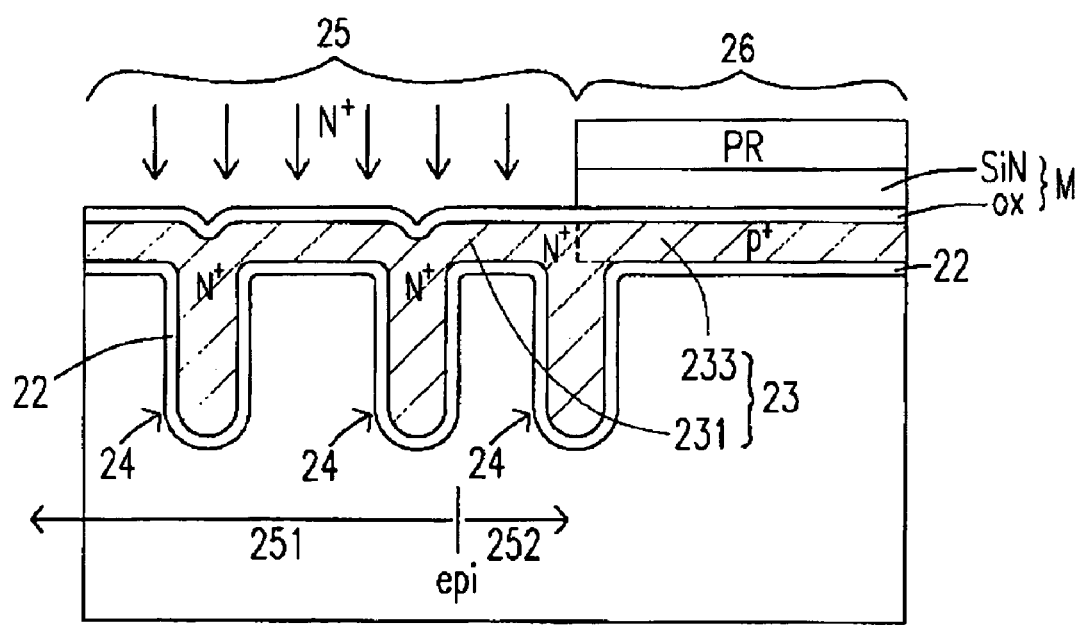

In FIG. 2(b), after forming the photoresist PR, the uncovered portion of the silicon nitrite layer SiN is removed by etching. The etching for the silicon nitrite layer SiN stops at the oxide layer ox, and after this etching the mask layer M is formed. The mask layer M includes the un-etched silicon nitrite layer SiN and the oxide layer ox of the planar area 26. The mask layer M is applied to retain the polysilicon layer 233 of the planar area 26. In addition, dopants are implanted onto the surface of the polysilicon layer 231, which is uncovered by the mask layer M.

According to the present embodiment, the dopants are implanted by the ion implantation. The dopants can be N type ions N+, such as the phosphorous ion. Although the present invention is illustrated with the NMOS, it is also applicable to other manufacturing process of the power MOS.

Figure 2C:
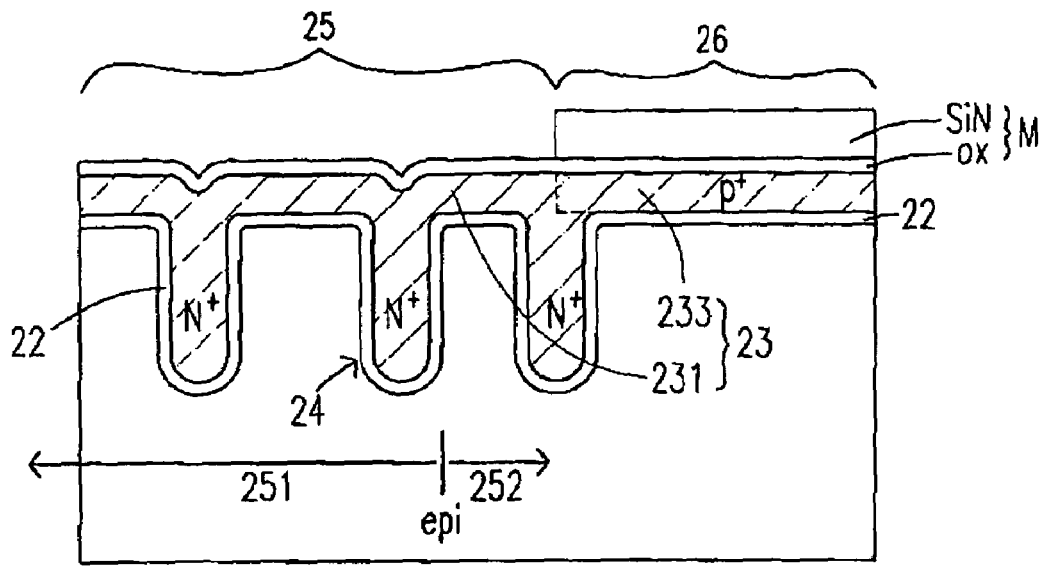

Subsequently, the photoresist PR is removed, and N type ions N+ dispersed on the upper surface are driven into the polysilicon layer 231 of the trench area 25 by heating and diffusing. As shown in FIG. 2(c), the dopant type of the polysilicon layer 231 of the trench area 25 has been changed from the P type into the N type.

Figure 2D:
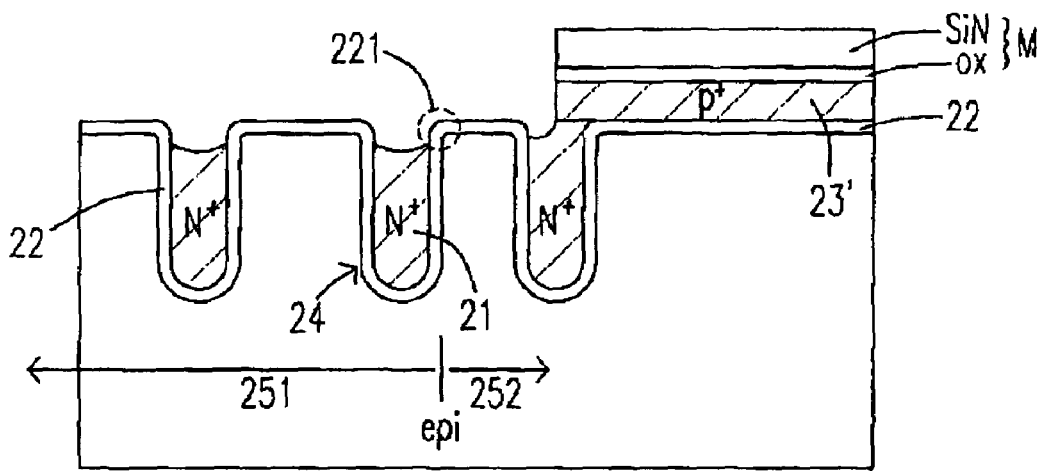

In order to form the gate of the trench MOS and the polysilicon layer of the ESD protection circuit simultaneously, the mask layer M is used as a hard mask to protect the polysilicon layer of the ESD protection circuit from etching. Referring to FIG. 2(d), it could be seen that the polysilicon layer 23' of the ESD protection circuit is preserved therefrom. Moreover, only one polysilicon layer etching is applied so that the corner oxide layer 221 will not be repeatedly etched and eroded. Therefore, it is easier to maintain the even thickness of the gate oxide layer 22.

Figure 2E:
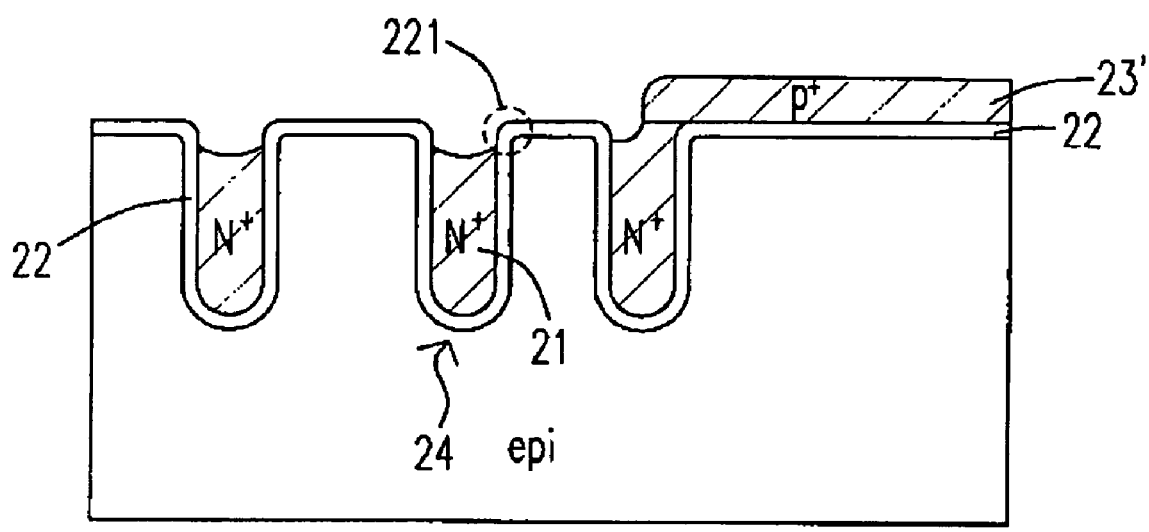

After the mask layer M is removed, the gate 21 of the trench MOS and the polysilicon layer 23' of the ESD protection circuit are individually formed. As shown in FIG. 2(e), the gate 21 of the trench MOS formed thereon is an N type polysilicon layer, and the polysilicon layer 23' of the ESD protection circuit formed thereon is a P type polysilicon layer. Moreover, an N type region in the P type polysilicon layer can be further defined. For example, it can be defined as the NPN or NPNPN polysilicon layer. In addition, the silicon nitride layer SiN and the oxide layer ox can be removed by using phosphoric acid and hydrofluoric acid respectively.

According to the manufacturing process illustrated in the above steps of FIGS. 2(a)–2(e), an integrated circuit is provided. According to the integrated circuit of the present embodiment, the manufacturing process and the structure of NMOS are indeed illustrated. However, the present manufacturing process and structure for the integrated circuits are also applicable to the PMOS and the CMOS.

Figure 3:
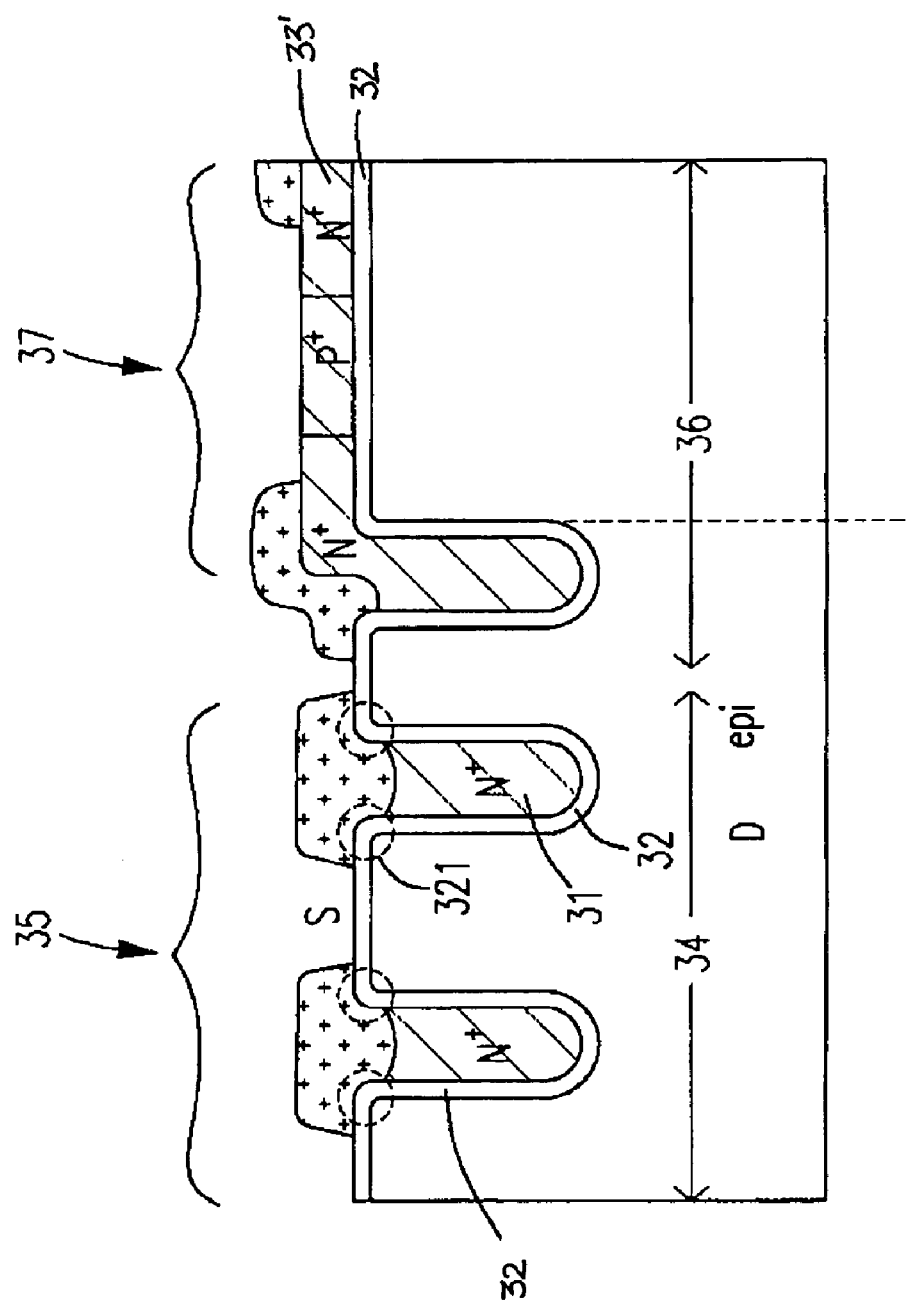
FIG. 3 is a schematic view showing a trench double-diffused MOS with an ESD protection circuit according to an embodiment of the present invention.

FIG. 3 is a schematic view showing a trench double-diffused MOS with an ESD protection circuit according to the present process. The epitaxial layer epi is used for the semiconductor material and has the trench area 34 and the planar area 36. On the surface of the semiconductor material is the insulating layer 32. On the insulating layer 32 in the trench area 34, the trench double-diffused MOS 35 is formed thereon, and it includes the source S, the drain D, and the gate 31. On the insulating layer 32 in the planar area 36, the ESD protection circuit 37 is formed thereon. The polysilicon layer 23' of the ESD protection circuit 37 is defined as the NPN polysilicon layer. In addition, the insulating layer 32 has an even thickness. The insulating layer 32 in the trench area 34 can be used as the gate oxide layer of the trench double diffused MOS 35, and the insulating layer 32 in the planar area 36 can be used as the dielectric layer of the ESD protection circuit 37.

It is one feature of the present invention that the gate 31 and the polysilicon layer 33' are formed from the same polysilicon layer deposition and etching. Accordingly, the manufacturing process of the power MOS would be simplified and the production cost would be reduced. In addition, only one step of etching is applied to the corner oxide layer 321, so it is easier to maintain an even thickness of the corner oxide layer 321. Therefore, the relevant problem of electric leakage at the gate oxide layer is overcome and the yield would be increased accordingly.

In sum, the present invention provides a new method and the structure for fabricating an integrated circuit. According to the method, a trench device and a planar device can be formed simultaneously. Moreover, the conventional technical process of employing two polysilicon layer depositions and two polysilicon layer etchings is concretely improved and can be replaced by the present invention so that it can be applied to the industry. Therefore, the present invention possesses the outstanding technical features in the field of the power device.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for fabricating an integrated circuit comprising:
   forming a first oxide layer on a semiconductor material having at least one trench;
   forming a polysilicon layer on said first oxide layer, wherein said polysilicon layer includes a polysilicon layer portion of a trench area and a polysilicon layer portion of a planar area; and etching a part of said polysilicon layer so as to form a gate of a trench device in said trench area and a polysilicon layer of a planar device in said planar area simultaneously; and wherein before etching said part of said polysilicon layer said method further comprises:

implanting a first dopant into said polysilicon layer portion of said trench area; and covering said polysilicon layer portion of said planar area with a mask layer; and wherein said first dopant is inplanted into said polysilicon layer portion of said trench area by an ion implantation; and wherein said ion implantation is performed by heating and diffusing.

2. The method according to claim 1, wherein said first oxide layer has an even thickness.

3. The method according to claim 1, wherein said polysilicon layer has a second dopant.

4. The method according to claim 1, wherein said trench device is a trench double-diffused MOS (DMOS).

5. A method for fabricating an integrated circuit comprising:

forming a first oxide layer on a semiconductor material having at least one trench;

forming a polysilicon layer on said first oxide layer, wherein said polysilicon layer includes a polysilicon layer portion of a trench area and a polysilicon layer portion of a planar area; and etching a part of said polysilicon layer so as to form a gate of a trench device in said trench area and a polysilicon layer of a planar device in said planar area simultaneously; and wherein before etching said part of said polysilicon layer said method further comprises:

implanting a first dopant into said polysilicon layer portion of said trench area; and covering said polysilicon layer portion of said planar area with a mask layer; and wherein said mask layer includes a second oxide layer and a silicon nitride layer.

6. The method according to claim 5, wherein after etching said part of said polysilicon layer said method further comprises:

removing said mask layer; and defining said polysilicon layer portion of said planar device.

7. The method according to claim 5, wherein said first oxide layer has an even thickness.

8. The method according to claim 5, wherein said polysilicon layer has a second dopant.

9. The method according to claim 5, wherein said trench device is a trench double-diffused MOS (DMOS).

10. A method for fabricating an integrated circuit, comprising:

forming a first oxide layer on a semiconductor material having at least one trench;

forming a polysilicon layer on said first oxide layer, wherein said polysilicon layer includes a polysilicon layer portion of a trench area and a polysilicon layer portion of a planar area; and etching a part of said polysilicon layer so as to form a gate of a trench device in said trench area and a polysilicon layer of a planar device in said planar area simultaneously; and wherein said planar device is an electrostatic discharge (ESD) protection circuit.

11. An integrated circuit comprising:

a semiconductor material having a trench area and a planar area;

an insulating layer formed on said semiconductor material;

a polysilicon layer formed on said insulating layer, said polysilicon layer including a polysilicon layer portion of a trench area over a polysilicon layer portion of a planar area;

a trench device formed on said insulating layer on said trench area; and a planar device formed on said insulating layer on said planar area, wherein a gate of said trench device and a polysilicon layer of said planar device are formed simultaneously by etching a part of said polysilicon layer; and wherein said planar device is an electrostatic discharge (ESD) protection circuit.

12. The integrated circuit according to claim 11 wherein said insulating layer has an even thickness.

13. The integrated circuit according to claim 11 wherein said insulating layer on said trench area is a gate oxide layer of said trench device.

14. The integrated circuit according to claim 11 wherein said insulating layer on said planar area is a dielectric layer of said planar device.

15. The integrated circuit according to claim 11 wherein said trench device is a trench double-diffused MOS (DMOS).

16. The integrated circuit according to claim 11 wherein said gate of said trench device comprises a first dopant.

17. The integrated circuit according to claim 16, wherein said polysilicon layer of said planar area comprises a second dopant.

18. The integrated circuit according to claim 11, wherein said insulating layer comprises oxide.

19. An integrated circuit comprising:

a semiconductor material having a trench area and a planar area;

an insulating layer formed on said semiconductor material;

a polysilicon layer formed on said insulating layer, said polysilicon layer including a polysilicon layer portion of a trench area over a polysilicon layer portion of a planar area;

a trench device formed on said insulating layer on said trench area; and a planar device formed on paid insulating layer on said planar area, wherein a gate of said trench device and a polysilicon layer of said planar device are formed simultaneously by etching a part of said polysilicon layer; and wherein said gate of said trench device comprises N dopant and wherein said polysilicon layer in said planar device comprises an NPN polysilicon layer.

* * * * *